(12) United States Patent
Song

(10) Patent No.: US 7,759,994 B2
(45) Date of Patent: Jul. 20, 2010

(54) SKEW SIGNAL GENERATION CIRCUIT AND SEMICONDUCTOR MEMORY DEVICE HAVING THE SAME

(75) Inventor: Ho Uk Song, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 50 days.

(21) Appl. No.: 12/005,495

(22) Filed: Dec. 27, 2007

(65) Prior Publication Data

US 2009/0002046 A1 Jan. 1, 2009

(30) Foreign Application Priority Data

Jun. 27, 2007 (KR) ...................... 10-2007-0063932

(51) Int. Cl.
*H03K 5/12* (2006.01)
(52) U.S. Cl. ........................................ 327/170; 326/30
(58) Field of Classification Search ..................... 326/30
See application file for complete search history.

(56) References Cited

U.S. PATENT DOCUMENTS 7,038,486 B2 * 5/2006 Aoyama et al. ............... 326/30
2007/0146036 A1 6/2007 Kwon

FOREIGN PATENT DOCUMENTS

| KR | 10-2004-0076715 A | 9/2004 |
| KR | 10-2005-0100290 A | 10/2005 |
| KR | 10-2006-0032095 A | 4/2006 |

\* cited by examiner

*Primary Examiner*—Lincoln Donovan
*Assistant Examiner*—Daniel Rojas
(74) *Attorney, Agent, or Firm*—John P. White; Cooper & Dunham LLP

(57) ABSTRACT

In a skew signal generation circuit, a pad is connected to an external resistor and a code generator compares a voltage of the pad with a reference voltage to generate a plurality of codes. A skew signal extractor extracts a skew signal from the codes, the skew signal containing information about a current characteristic of a MOS transistor. A driver calibrates a drivability in response to the skew signal.

14 Claims, 5 Drawing Sheets

SKEW SIGNAL GENERATION CIRCUIT AND SEMICONDUCTOR MEMORY DEVICE HAVING THE SAME

BACKGROUND

The present disclosure relates to a semiconductor memory device, and more particularly, to a skew signal generation circuit, which extracts a current characteristic of a transistor in an impedance calibrator and generates a skew signal for controlling the timing of internal circuits, and a semiconductor memory device having the same.

Generally, a termination resistor having the same resistance as a characteristic resistance of a transmission channel is connected to a receiving terminal or a transmitting terminal of a semiconductor device. The termination resistor suppresses reflection of signals being transmitted through the transmission channel by matching the characteristic impedance of the transmission channel with the impedance of the receiving terminal or the transmitting terminal. Conventionally, the termination resistor has been installed outside a semiconductor chip. Recently, an on-die termination (ODT) is widely used. The ODT includes a termination resistor inside a semiconductor chip. The ODT includes a switching circuit that is switched on/off to control a current flowing inside. Therefore, compared with the termination resistor installed outside the chip, the ODT has low power consumption. However, the resistance of the ODT needs to be calibrated because the resistance of the ODT varies with process, voltage and temperature (PVT).

In a double data rate-3 (DDR3) memory device, an impedance (ZQ) calibration circuit is used to calibrate the resistance of an ODT. An output impedance calibration circuit includes an external resistor (ZQ) between an extra output terminal separated from a DQ terminal of the ODT and a ground terminal. The external resistor (ZQ) has a constant resistance with respect to variation of PVT. Therefore, the output impedance calibration circuit controls a pull-up drivability of a DQ terminal of the ODT according to the variation of PVT, especially skew variation of a transistor. The skew of the transistor is a parameter representing a current characteristic of the transistor and is classified into "SLOW", "TYPICAL", and "FAST" according to the current characteristic required by a manufacturer. The "SLOW" state represents that an amount of a current is small, the "TYPICAL" state represents that an amount of a current is normal, and the "FAST" state represents that an amount of a current is large.

The output impedance of the ODT is calibrated according to the skew variation of the transistor. However, output impedances of other internal circuits included in the semiconductor memory device are not calibrated according to the skew variation of the transistor.

SUMMARY

In an aspect of the present disclosures a skew signal generation circuit, which extracts a current characteristic of a transistor in an impedance calibrator and generates a skew signal for controlling the timing of internal circuits, and a semiconductor memory device having the same are provided.

In an exemplary embodiment, a skew signal generation circuit includes a pad connected to an external resistor, a code generator configured to compare a voltage of the pad with a reference voltage to generate a plurality of codes, a skew signal extractor configured to extract a skew signal from the codes, the skew signal containing information about a current characteristic of a MOS transistor, and a driver configured to calibrate a drivability in response to the skew signal.

The code may vary according to the current characteristic of the MOS transistor.

The code generator may include a comparator configured to compare the voltage of the pad with the reference voltage, and a counter configured to perform a counting operation in response to an output signal of the comparator and generate the plurality of codes.

The skew signal extractor may extract the skew signal by selecting first and second codes from the plurality of codes.

The skew signal extractor may include a first logic element configured to perform a logic operation on the first and second codes to generate a first skew signal, a second logic element configured to perform a logic operation on an inverted signal of the first code and the second code to generate a second skew signal, and a third logic element configured to perform a logic operation on the first and second codes to generate a third skew signal.

The first logic element may perform a NOR operation, the second logic element may perform a NOR operation, and the third logic element may perform an AND operation.

In another exemplary embodiment, a semiconductor memory device includes an impedance calibrator configured to calibrate an output impedance, a skew signal extractor configured to extract a skew signal containing information about a current characteristic of a transistor in the impedance calibrator, and an input buffer configured to control an output timing of an input signal in response to the skew signal.

The impedance calibrator may include a code generation unit configured to compare a reference voltage with a voltage of a pad connected to an external resistor to generate a plurality of codes, and a driving unit configured to calibrate a drivability in response to the skew signal.

The input buffer may include a delayer configured to control a delay time in response to the first to third skew signals.

The delayer may include a first delay unit configured to delay the input signal by a first delay time, a second delay unit configured to delay the input signal by a second delay time, a third delay unit configured to delay the input signal by a third delay time, a first transfer unit configured to transfer an output signal of the first delay unit in response to the first skew signal, a second transfer unit configured to transfer an output signal of the second delay unit in response to the second skew signal, and a third transfer unit configured to transfer an output signal of the third delay unit in response to the third skew signal.

The first to third delay units may be implemented with inverter chains. The first to third transfer units may be implemented with transfer gates.

In another exemplary embodiment, a semiconductor memory device includes an impedance calibrator configured to calibrate an output impedance, a skew signal extractor configured to extract a skew signal containing information about a current characteristic of a transistor in the impedance calibrator and an address buffer configured to control an output timing of an input address in response to the skew signal.

The address buffer comprises an electrostatic discharge protector receiving the input address to discharge an electrostatic voltage, a receiver buffering an output address of the electrostatic discharge protector and a delayer delaying an output address of the receiver by a predetermined time in response to the skew signal.

DESCRIPTION OF EXEMPLARY EMBODIMENTS

Hereinafter, a skew signal generation circuit and a semiconductor memory device having the same in accordance with examples and exemplary embodiments of the present invention will be described in detail with reference to the accompanying drawings.

Figure 1:
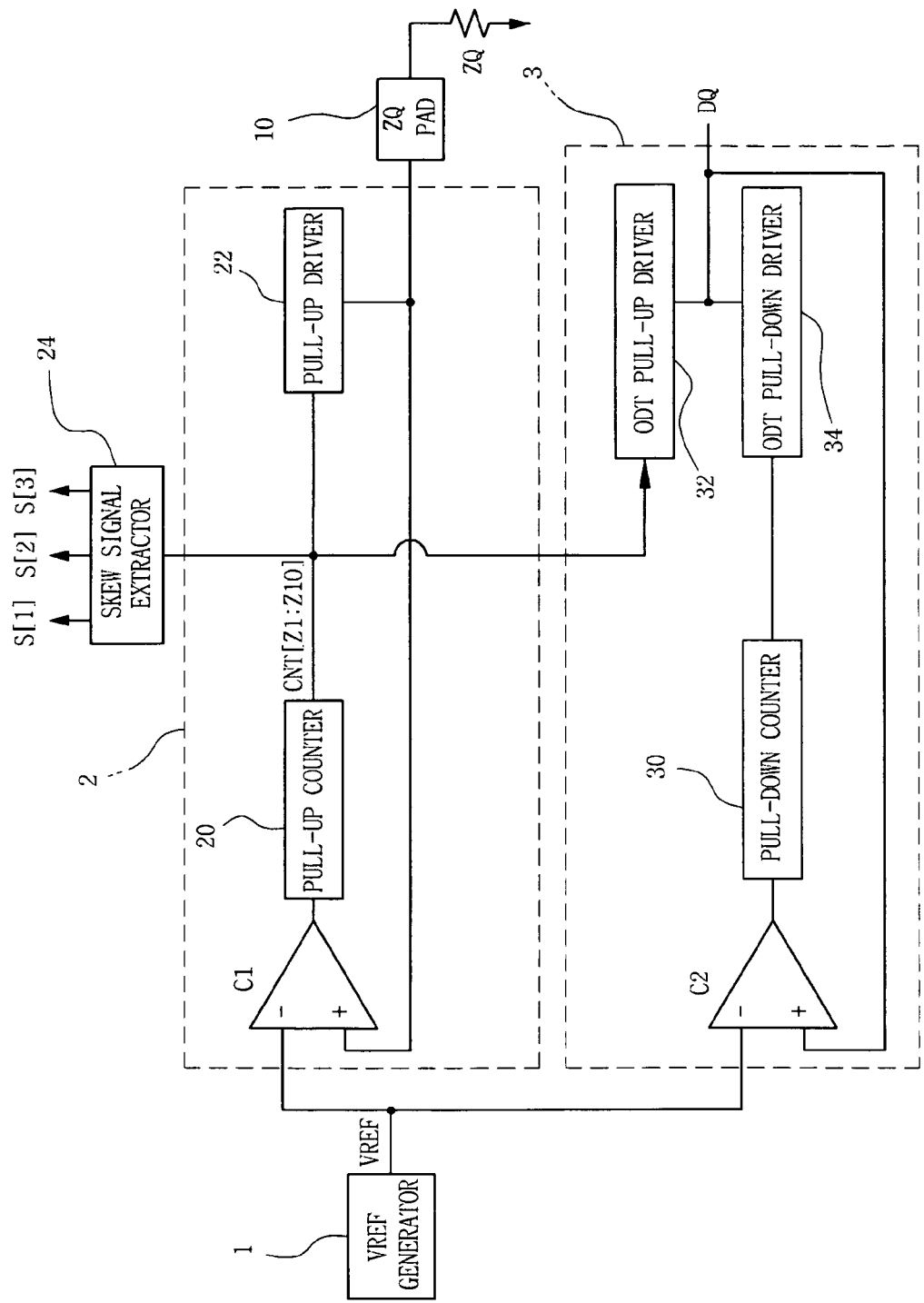
FIG. 1 illustrates a block diagram of a skew signal generation circuit according to an exemplary embodiment of the present invention.
Figure 2:
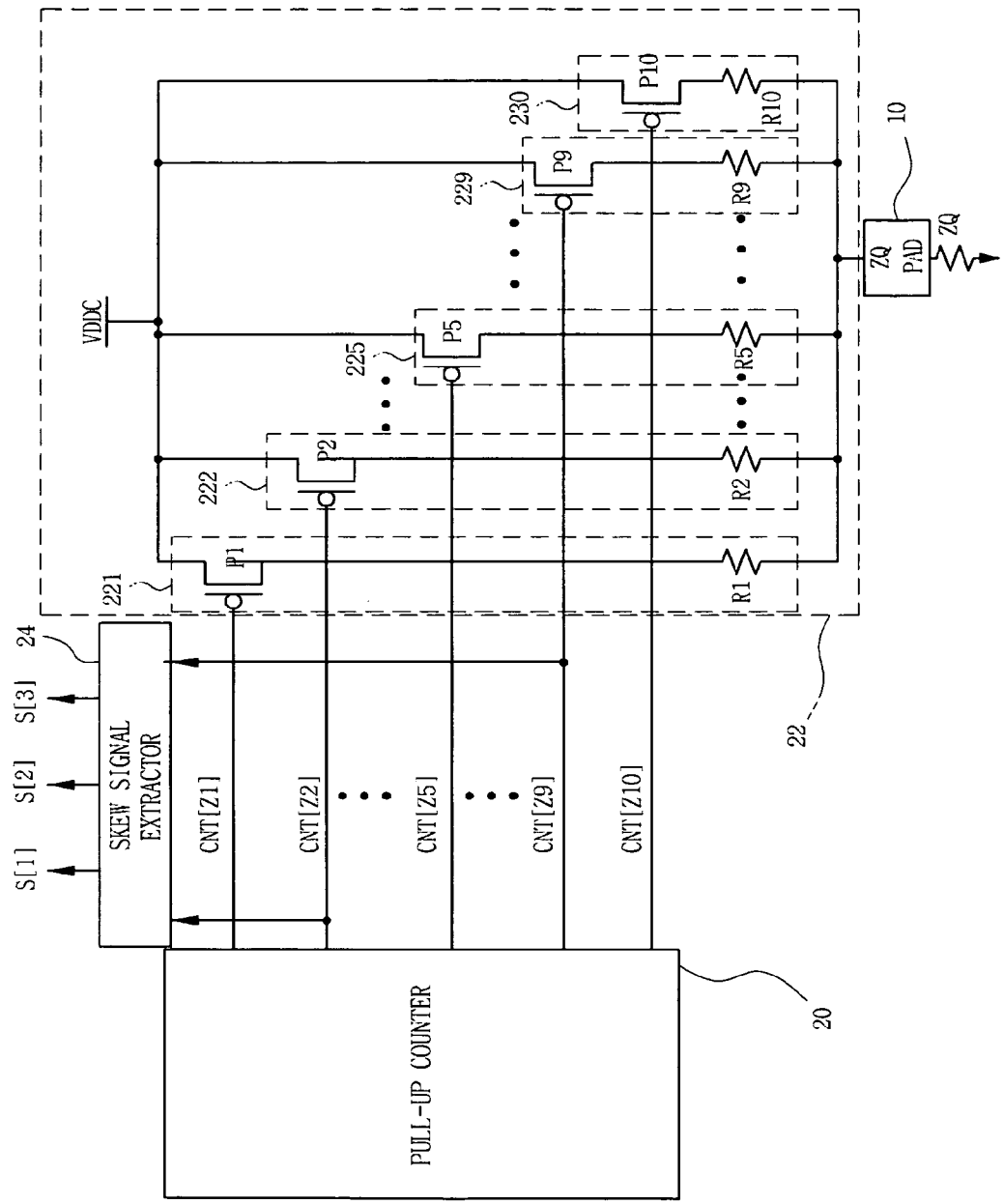
FIG. 2 illustrates a circuit diagram of a pull-up counter, a skew signal extractor, and a pull-up driver in the skew signal generation circuit of FIG. 1.
Figure 3:
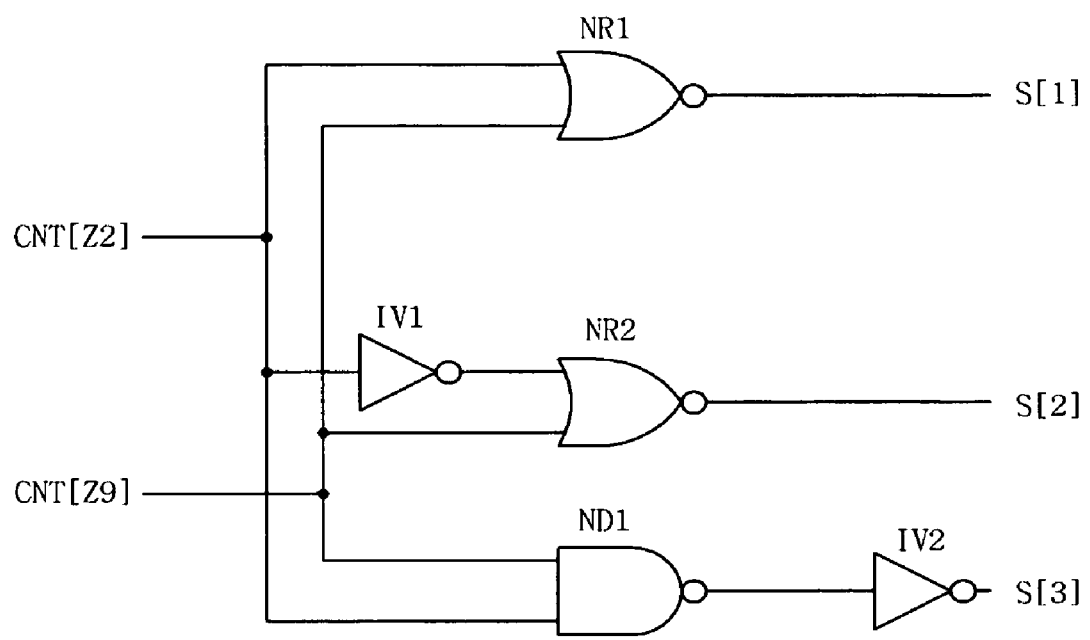
FIG. 3 illustrates a circuit diagram of the skew signal extractor of FIG. 2.

FIG. 1 illustrates a block diagram of a skew signal generation circuit according to an exemplary embodiment of the present invention, FIG. 2 illustrates a circuit diagram of a pull-up counter, a skew signal extractor, and a pull-up driver in the skew signal generation circuit of FIG. 1, and FIG. 3 illustrates a circuit diagram of the skew signal extractor of FIG. 2.

Referring to FIG. 1, the skew signal generation circuit includes a reference voltage generator 1, a ZQ pad 10, an impedance calibrator 2, a skew signal extractor 24, and an ODT 3. An external resistor ZQ is connected to the ZQ pad 10.

The reference voltage generator 1 generates a predetermined reference voltage VREF and is implemented with a typical voltage generator.

The impedance calibrator 2 includes a first comparator C1 configured to compare the reference voltage VREF with a voltage of the ZQ pad 10, and a pull-up counter 20 configured to perform a counting operation in response to an output signal of the first comparator C1 to generate first to tenth codes CNT[Z1:Z10]. The number of the codes generated by the pull-up counter 20 may be variously changed in corresponding exemplary embodiments of the present invention. In addition, the impedance calibrator 2 further includes a pull-up driver 22, a pull-up drivability of which is controlled in response to the first to tenth codes CNT[Z1:Z10]. The impedance calibrator 2 may include a typical output impedance calibrator that adjusts the resistance of the ODT 3 according to skew variation of a transistor.

The ODT 3 includes a second comparator C2, a pull-down counter 30, an ODT pull-up driver 32, and an ODT pull-down driver 34. The second comparator C2 compares the reference voltage VREF with a voltage of the DQ pad. The pull-down counter 30 performs a counting operation in response to an output signal of the second comparator C2. The ODT pull-up driver 32 pulls up the DQ pad in response to a signal applied to the ZQ pad 10. The ODT pull-down driver 34 pulls down the DQ pad in response to the codes generated from the pull-down counter 30. The ODT 3 is mounted inside a DRAM cell so as to suppress reflection of signals input to the DQ bus. The ODT 3 may be implemented with a typical ODT.

Referring to FIG. 2, the pull-up driver 22 includes first to tenth pull-up drivers 221 to 230 connected between a power supply voltage terminal VDDC and the ZQ pad 10. The first to tenth pull-up drivers 221 to 230 include PMOS transistors P1 to P10 and resistors R1 to R10 serially connected thereto, respectively. The PMOS transistors P1 to P10 are turned on in response to the first to tenth codes CNT[Z1:Z10], respectively. The skew signal extractor 24 receives the second code CNT[Z2] and the ninth code CNT[Z9] to extract first to third skew signals S[1], S[2] and S[3].

Referring to FIG. 3, the skew signal extractor 24 includes a NOR gate NR1 configured to perform a NOR operation on the second code CNT[Z2] and the ninth code CNT[9], a NOR gate NR2 configured to perform a NOR operation on an inverted signal of the second code CNT[Z2] and the ninth code CNT[Z9], a NAND gate ND1 configured to perform a NAND operation on the second code CNT[Z2] and the ninth code CNT[Z9], and an inverter IV2 configured to invert an output signal of the NAND gate ND1.

An operation of the skew signal generation circuit will be described below with reference to FIGS. 1 to 3.

When the impedance calibrator 2 of FIG. 1 performs an output impedance calibration, the pull-up counter 20 counts the first to tenth codes CNT[Z1:Z10] according to the skew of the transistor. The counting operation of the pull-up counter 20 will be described below in more detail.

As the skew of the transistor changes to the "SLOW" state, the drivability of the pull-up driver 22 is reduced and the level of the ZQ pad 10 is lower than that of the reference voltage VREF. Accordingly, the pull-up counter 20 performs a counting operation to increase the number of signals enabled to a logic low level among the first to tenth codes CNT[Z1:Z10]. For example, if the counting operation is performed when the fifth to tenth codes CNT[Z5:Z10] are enabled to a logic low level, the fourth to tenth codes CNT[Z4:Z10] change to an enabled state. Referring to FIG. 2, as the number of the enabled signals among the first to tenth codes CNT[Z1:Z10] increases, the resistance of the pull-up driver 22 decreases, thereby improving its drivability. Hence, the level of the ZQ pad 10 increases. The counting operation of the pull-up counter 20 is repeated until the level of the ZQ pad 10 is equal to the reference voltage VREF.

As the skew of the transistor changes to the FAST state, the drivability of the pull-up driver 22 is improved and the level of the ZQ pad 10 is higher than the reference voltage VREF. Accordingly, the pull-up counter 20 performs a counting operation to decrease the number of signals enabled to a logic low level among the first to tenth codes CNT[Z1:Z10]. For example, if the counting operation is performed when the fifth to tenth codes CNT[Z5:Z10] are enabled to a logic low level, the sixth to tenth codes CNT[Z6:Z10] change to an enabled state. Referring to FIG. 2, as the number of the enabled signals among the first to tenth codes CNT[Z1:Z10] decreases, the resistance of the pull-up driver 22 increases, thereby reducing its drivability. Hence, the level of the ZQ pad 10 decreases. The counting operation of the pull-up counter 20 is repeated until the level of the ZQ pad 10 is equal to the reference voltage VREF.

As described above, the impedance calibrator 2 changes the drivability of the pull-up counter 20 by changing a number of signals enabled among the first to tenth codes CNT[Z1:Z10] according to the skew of the transistor. This means that the skew of the transistor is closely associated with the number of the first to tenth codes CNT[Z1:Z10] enabled.

When the skew of the transistor is in the SLOW state, the pull-up counter 20 of FIG. 2 enables the second to tenth codes CNT[Z2:Z10] to a logic low level so as to turn on at least the second to tenth pull-up drivers 222 to 230. When the skew of the transistor is in the FAST state, the pull-up counter 20 enables the tenth code CNT[Z10] to a logic low level so as to turn on only the tenth pull-up driver 230. When the skew of the transistor is in the TYPICAL state, the pull-up counter 20 enables the pull-up drivers (from the second to tenth pull-up drivers 222 to 230) that are less than a number at the SLOW state and more than the FAST state. This configuration can be easily made by properly adjusting sizes of the PMOS transistors P1 to P10 and the resistors R1 to R10 included in the pull-up driver 22. Further, the number and combination of the signals enabled among the first to tenth codes CNT[Z1:Z10] can be modified according to the skew state of the transistor.

The skew signal extractor 24 of FIG. 2 generates the first to third skew signals S[1], S[2] and S[3] containing the skew information of the transistor according to the characteristics of the first to tenth codes CNT[Z1:Z10].

Referring to FIG. 3, the skew signal extractor 24 generates the first to third skew signals S[1], S[2] and S[3] according to combination of the second code CNT[Z2] and the ninth code CNT[Z9]. More specifically, when both the second code CNT[Z2] and the ninth code CNT[Z9] are at the logic high level, which will be referred to hereinafter as a first combination, the skew signal extractor 24 generates the third skew signal S[3] of the logic high level. When the second code CNT[Z2] is at the logic high level and the ninth code CNT[Z9] is at the logic low level, which will be referred to hereinafter as a second combination, the skew signal extractor 24 generates the second skew signal S[2] of the logic high level. When both the second code CNT[Z2] and the ninth code CNT[Z9] are at the logic low level, which will be referred to hereinafter as a third combination, the skew signal extractor 24 generates the first skew signal S[1] of the logic high level. A combination in which the second code CNT[Z2] is at the logic low level and the ninth code CNT[9] is at the logic high level cannot be generated. The reason for this is that all of the third to tenth codes CNT[Z3:Z10] become the logic low level.

Since the first combination enables only the tenth code CNT[Z10] to the logic low level, the skew of the transistor is the FAST state. Accordingly, when the third skew signal S[3] is enabled to the logic high level, it can be confirmed that the skew of the transistor is the FAST state. Since the third combination enables at least the second to tenth codes CNT[Z] to CNT[Z10] to the logic low level, the skew of the transistor is the SLOW state. Accordingly, when the first skew signal S[1] is enabled to the logic high level, it can be confirmed that the skew of the transistor is the SLOW state. Further, the second combination enables the ninth and tenth codes CNT[Z9] and CNT[Z10] to the logic low level. Compared with the third combination, the number of the codes enabled to the logic low level is small. Thus, the skew of the transistor is the TYPICAL state.

The first to third skew signals S[1], S[2] and S[3] generated from the skew signal extractor 24 are used to control the timing of the input circuits in the semiconductor memory device. The timing control of the input circuits using the first to third skew signals S[1], S[2] and S[3] will be described below in detail with reference to FIGS. 4 and 5.

Figure 4:
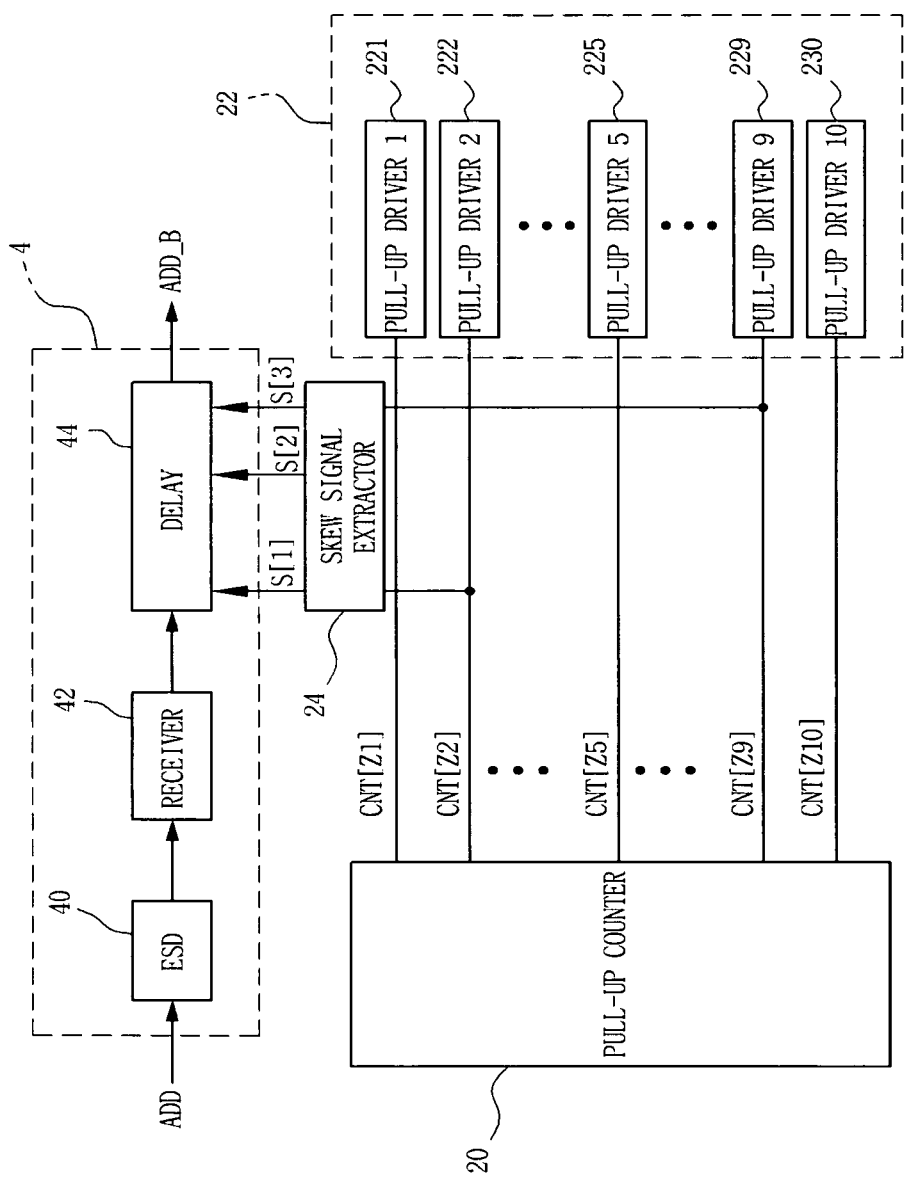
FIG. 4 illustrates a block diagram of a semiconductor memory device to which the skew signal generation circuit of FIG. 1 is applied.
Figure 5:
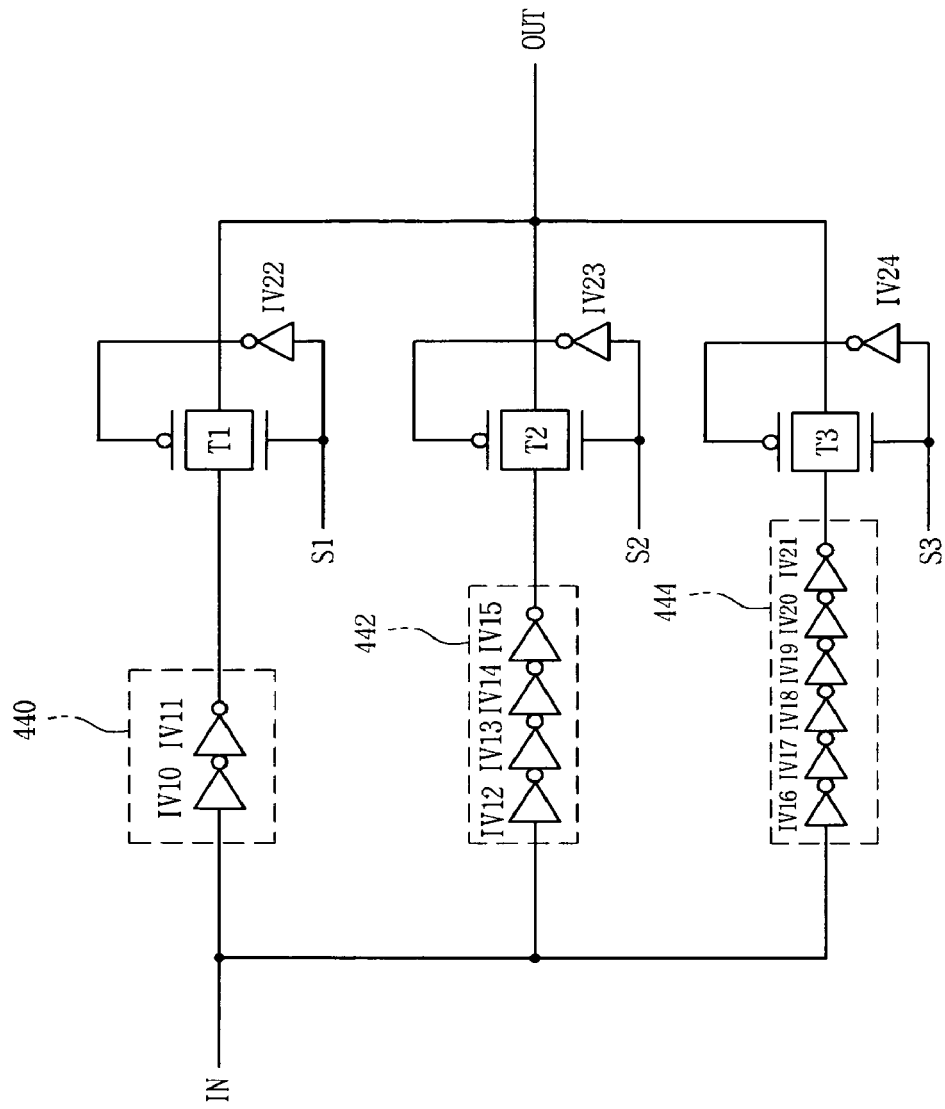
FIG. 5 illustrates a circuit diagram of a delayer of FIG. 4.

Referring to FIGS. 4 and 5, the first to third skew signals S[1], S[2] and S[3] generated from the skew signal extractor 24 are input to an address buffer 4, which is one of the input circuit.

The address buffer 4 includes an electrostatic discharge (ESD) protector 40, a receiver 42, and a delayer 44. The ESD protector 40 receives an address signal ADD to discharge an electrostatic voltage. The receiver 42 buffers the address signal from which the electrostatic voltage is discharged. The delayer 44 delays the address signal ADD output from the receiver 42 by a predetermined time in response to the first to third skew signals S[1], S[2] and S[3]. The address buffer 4 controls setup/hold time of the address signal ADD by delaying the address signal ADD by a predetermined time. That is, the address buffer 4 controls the timing of the address signal ADD with respect to a clock signal.

Referring to FIG. 5, the delayer 44 includes a first delay unit 440 configured to delay an input signal IN by a first delay time, a second delay unit 442 configured to the input signal IN by a second delay time, a third delay unit 444 configured to delay the input signal IN by a third delay time, a first transfer gate T1 configured to transfer an output signal of the first delay unit 440 in response to the first skew signal S[1], a second transfer gate T2 configured to transfer an output signal of the second delay unit 442 in response to the second skew signal S[2], and a third transfer gate T3 configured to transfer an output signal of the third delay unit 444 in response to the third skew signal S[3]. Each of the first to third delay units may be implemented with an inverter chain. The first delay time of the first delay unit 440 is shortest and the third delay time of the third delay unit 444 is longest.

The delayer 44 controls the delay of the input signal IN in response to the first to third skew signals S[1], S[2] and S[3]. For example, when the skew of the transistor is "SLOW", the first skew signal S[1] is enabled to the logic high level and the second and third skew signals S[2] and S[3] become the logic low level. Therefore, only the first transfer gate T1 is turned on so that the input signal IN is delayed by the first delay time of the first delay unit 440. When the skew of the transistor is "TYPICAL", the second skew signal S[2] is enabled to the logic high level and the first and third skew signals S[1] and S[3] become the logic low level. Therefore, only the second transfer gate T2 is turned on so that the input signal IN is delayed by the second delay time of the second delay unit 442. When the skew of the transistor is "FAST", the third skew signal S[3] is enabled to the logic high level and the first and second skew signals S[1] and S[2] become the logic low level. Therefore, only the third transfer gate T3 is turned on so that the input signal IN is delayed by the third delay time of the third delay unit 444.

As described above, the address buffer 4 controls the delay of the address signal ADD according to the first to third skew signals S[1], S[2] and S[3]. That is, when the skew of the transistor is "SLOW", the drivability of the inverter decreases. Therefore, the address buffer 4 decreases the delay time of the delayer 44. When the skew of the transistor is "FAST", the drivability of the inverter increases. Therefore, the address buffer 4 increases the delay time of the delayer 44. In this way, the address buffer 4 can control the setup/hold time of the address signal ADD.

The skew signal generation circuit according to the above-described exemplary embodiments of the present invention extracts the information about the current characteristics of the transistor in the impedance calibrator and uses the extracted information to control the timing of the internal circuits.

While the subject matter of this disclosure has been described with respect to examples and exemplary embodiments of the present invention, it will be apparent to those skilled in the art that various changes and modifications may be made without departing from the spirit and scope of the invention as defined in the following claims.

The present application claims priority to Korean patent application number 10-2007-0063932, filed on Jun. 27, 2007, the entire contents of which are incorporated herein by reference.

What is claimed is:

1. A skew signal generation circuit, comprising:
    a pad connected to an external resistor;
    a code generator configured to compare a voltage of the pad with a reference voltage to generate a plurality of codes;
    a skew signal extractor configured to extract a skew signal by selecting a first code and a second code from the plurality of codes,
    wherein the skew signal extractor comprises a first logic element configured to perform a first logic operation on the first code and the second code to generate a first skew signal, a second logic element configured to perform a second logic operation on an inverted signal of the first code and the second code to generate a second skew signal, and a third logic element configured to perform a third logic operation on the first code and the second code to generate a third skew signal; and
    a driver configured to calibrate a drivability in response to the codes.

2. The skew signal generation circuit of claim 1, wherein the codes vary according to the current characteristic of the MOS transistor.

3. The skew signal generation circuit of claim 1, wherein the code generator comprises:
    a comparator configured to compare the voltage of the pad with the reference voltage; and
    a counter configured to perform a counting operation in response to an output signal of the comparator and generate the plurality of codes.

4. The skew signal generation circuit of claim 1, wherein the first logic element performs a NOR operation, the second logic element performs a NOR operation, and the third logic element performs an AND operation.

5. A semiconductor memory device, comprising:
    a code generation unit configured to compare a reference voltage with a voltage of a pad connected to an external resistor to generate a plurality of codes;
    a skew signal extractor configured to extract a skew signal by selecting a first code and a second code from the plurality of codes,
    wherein the skew signal extractor comprises a first logic element configured to perform a first logic operation on the first and the second code to generate a first skew signal, a second logic element configured to perform a second logic operation on an inverted signal of the first code and the second code to generate a second skew signal, and a third logic element configured to perform a third logic operation on the first code and the second code to generate a third skew signal;
    a driving unit configured to calibrate a drivability in response to the codes that are enabled; and
    an input buffer configured to control an output timing of an input signal in response to the first, second and third skew signals.

6. The semiconductor memory device of claim 5, wherein the code generation unit comprises:
    a comparator configured to compare the reference voltage with the voltage of the pad; and
    a counter configured to perform a counting operation in response to an output signal of the comparator and generate the plurality of codes.

7. The semiconductor memory device of claim 5, wherein the first logic element performs a NOR operation, the second logic element performs a NOR operation, and the third logic element performs an AND operation.

8. The semiconductor memory device of claim 5, wherein the input buffer comprises a delayer configured to control a delay time in response to the first to third skew signals.

9. The semiconductor memory device of claim 8, wherein the delayer comprises:
    a first delay unit configured to delay the input signal by a first delay time;
    a second delay unit configured to delay the input signal by a second delay time;
    a third delay unit configured to delay the input signal by a third delay time;
    a first transfer unit configured to transfer an output signal of the first delay unit in response to the first skew signal;
    a second transfer unit configured to transfer an output signal of the second delay unit in response to the second skew signal; and
    a third transfer unit configured to transfer an output signal of the third delay unit in response to the third skew signal.

10. The semiconductor memory device of claim 9, wherein the first to third delay units comprise inverter chains.

11. The semiconductor memory device of claim 9, wherein the first to third transfer units comprise transfer gates.

12. A semiconductor memory device, comprising:
    a code generation unit configured to compare a reference voltage with a voltage of a pad connected to an external resistor to generate a plurality of codes;
    a skew signal extractor configured to extract a skew signal by selecting a first code and a second code from the plurality of codes,
    wherein the skew signal extractor comprises a first logic element configured to perform a first logic operation on the first and the second code to generate a first skew signal, a second logic element configured to perform a second logic operation on an inverted signal of the first code and the second code to generate a second skew signal, and a third logic element configured to perform a third logic operation on the first code and the second code to generate a third skew signal; and
    an address buffer configured to control an output timing of an input address in response to the skew signal,
    wherein the address buffer comprises an electrostatic discharge protector receiving the input address to discharge an electrostatic voltage, a receiver buffering an output address of the electrostatic discharge protector and a delayer delaying an output address of the receiver by a predetermined time in response to the skew signal.

13. The semiconductor memory device of claim 12, wherein the code generation unit comprises:
    a comparator configured to compare the reference voltage with the voltage of the pad; and
    a counter configured to perform a counting operation in response to an output signal of the comparator and generate the plurality of codes.

14. The semiconductor memory device of claim 12, wherein the delayer comprises:
    a first delay unit configured to delay the input signal by a first delay time;
    a second delay unit configured to delay the input signal by a second delay time;
    a third delay unit configured to delay the input signal by a third delay time;
    a first transfer unit configured to transfer an output signal of the first delay unit in response to the first skew signal;
    a second transfer unit configured to transfer an output signal of the second delay unit in response to the second skew signal; and
    a third transfer unit configured to transfer an output signal of the third delay unit in response to the third skew signal.

* * * * *